US012787616B2

(12) United States Patent
Lee et al.

(10) Patent No.: US 12,787,616 B2
(45) Date of Patent: Nov. 3, 2026

(54) DISPLAY DEVICE AND METHOD OF MANUFACTURING THE SAME

(71) Applicant: Samsung Display Co., LTD., Yongin-si (KR)

(72) Inventors: Jaehun Lee, Yongin-si (KR); Kabjong Seo, Yongin-si (KR); Junho Sim, Yongin-si (KR); Yang-Ho Jung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 424 days.

(21) Appl. No.: 18/233,821

(22) Filed: Aug. 14, 2023

(65) Prior Publication Data

US 2024/0065079 A1 Feb. 22, 2024

(30) Foreign Application Priority Data

Aug. 16, 2022 (KR) ........................ 10-2022-0102143

(51) Int. Cl.
*H10K 59/80* (2023.01)
*H10K 59/12* (2023.01)
*H10K 59/40* (2023.01)

(52) U.S. Cl.
CPC ..... *H10K 59/8792* (2023.02); *H10K 59/1201* (2023.02); *H10K 59/873* (2023.02); *H10K 59/40* (2023.02)

(58) Field of Classification Search
CPC ............. H10K 59/8792; H10K 50/844; H10K 59/1201; H10K 59/873; H10K 59/12; H10K 59/40; H10K 50/865
See application file for complete search history.

(56) References Cited

U.S. PATENT DOCUMENTS 8,334,653 B2 * 12/2012 Cha .......................... H01J 11/44 313/582
2008/0042569 A1 * 2/2008 Cha .......................... H01J 11/12 313/582

(Continued)

FOREIGN PATENT DOCUMENTS

JP 2010223996 A 10/2010
KR 20020037443 A 5/2002

(Continued)

OTHER PUBLICATIONS

IP.com, NPL search.*

(Continued)

*Primary Examiner* — Fatima N Farokhrooz
(74) *Attorney, Agent, or Firm* — CANTOR COLBURN LLP

(57) ABSTRACT

A display device includes: a substrate including a light emitting area and a non-light emitting area adjacent to the light emitting area, a light emitting element including a light emitting layer disposed in the light emitting area on the substrate, an encapsulation layer disposed on the light emitting layer and including at least one inorganic layer and at least one organic layer, and a plurality of light blocking patterns disposed on the encapsulation layer. Each of the plurality of light blocking patterns has an asymmetric shape with respect to a virtual center line thereof.

10 Claims, 18 Drawing Sheets

(56) References Cited

U.S. PATENT DOCUMENTS

| | | | | |
|---|---|---|---|---|
| 2008/0042570 | A1* | 2/2008 | Cha | H01J 11/12 313/582 |
| 2008/0197773 | A1* | 8/2008 | Cha | H01J 11/12 313/582 |
| 2010/0271721 | A1 | 10/2010 | Gaides et al. | |
| 2018/0006272 | A1 | 1/2018 | Lee et al. | |
| 2019/0221779 | A1 | 7/2019 | Jang et al. | |
| 2020/0168838 | A1* | 5/2020 | Hong | H10K 59/879 |
| 2021/0013455 | A1 | 1/2021 | Bae et al. | |
| 2021/0217831 | A1* | 7/2021 | Jung | H10K 59/873 |
| 2022/0069014 | A1* | 3/2022 | Choi | G06F 3/0446 |

FOREIGN PATENT DOCUMENTS

| | | | | |
|---|---|---|---|---|
| KR | 20060123829 | A | * 12/2006 | G02F 1/13439 |
| KR | 20090080814 | A | 7/2009 | |
| KR | 20160083554 | A | 7/2016 | |
| KR | 20180004380 | A | 1/2018 | |
| KR | 20180084333 | A | 7/2018 | |
| KR | 20190086605 | A | 7/2019 | |
| KR | 20190141928 | A | 12/2019 | |
| KR | 20200012681 | A | 2/2020 | |
| KR | 20210003655 | A | 1/2021 | |
| KR | 20210008265 | A | 1/2021 | |
| KR | 20210092351 | A | 7/2021 | |
| KR | 20220004262 | A | 1/2022 | |

OTHER PUBLICATIONS

Korean Office Action for Korean Application No. 10-2022-0102143; Report Mail Date Jan. 21, 2026 (11 Pages—with English Translation).

* cited by examiner

DISPLAY DEVICE AND METHOD OF MANUFACTURING THE SAME

This application claims priority to Korean Patent Application No. 10-2022-0102143, filed on Aug. 16, 2022, and all the benefits accruing therefrom under 35 U.S.C. § 119, the content of which in its entirety is herein incorporated by reference.

BACKGROUND

1. Field

Embodiments provide generally to a display device. More particularly, embodiments provide the display device that provides visual information and method of manufacturing the same.

2. Description of the Related Art

As information technology develops, the importance of display devices, which are communication media between users and information, is being highlighted. Accordingly, the use of display devices such as a liquid crystal display device, an organic light emitting display device, a plasma display device and the like is increasing.

Meanwhile, the display device may display an image having a wide viewing angle, or the viewing angle of an image displayed on the display device may be limited in order to improve security or image reflection.

SUMMARY

Embodiments provide a display device capable of effectively limiting a viewing angle.

Embodiments provide a method of manufacturing the display device.

A display device according to embodiments of the present disclosure includes: a substrate including a light emitting area and a non-light emitting area adjacent to the light emitting area, a light emitting element including a light emitting layer disposed in the light emitting area on the substrate, an encapsulation layer disposed on the light emitting layer and including at least one inorganic layer and at least one organic layer, and a plurality of light blocking patterns disposed on the encapsulation layer. Each of the plurality of light blocking patterns has an asymmetric shape with respect to a virtual center line thereof.

In an embodiment, each of the plurality of light blocking patterns may include a first side surface that is flat and a second side surface facing the first side surface, and the second side surface may be bent.

In an embodiment, an angle formed between each of the plurality of light blocking patterns and an upper surface of the encapsulation layer may be an acute angle or a right angle.

In an embodiment, each of the plurality of light blocking patterns may include molybdenum-tantalum oxide ("MTO") or an organic material including a black pigment.

In an embodiment, each of the plurality of light blocking patterns may not overlap the light emitting area and may overlap the non-light emitting area in a plan view.

In an embodiment, a portion of the plurality of light blocking patterns may overlap the light emitting area and another portion of the plurality of light blocking patterns may overlap the non-light emitting area in the plan view.

In an embodiment, each of the plurality of light blocking patterns may extend along a first direction, and the plurality of light blocking patterns may be spaced apart from each other along a second direction crossing the first direction.

In an embodiment, the display device may further include a light transmitting layer disposed on the encapsulation layer, covering the plurality of light blocking patterns, and including a transparent organic material.

In an embodiment, the display device may further include a touch sensing layer disposed between the encapsulation layer and the plurality of light blocking patterns, and including a first touch electrode and a second touch electrode, and the second touch electrode may be disposed on the first touch electrode and connected to the first touch electrode.

A method of manufacturing a display device according to embodiments of the present disclosure includes: forming a light emitting element including a light emitting layer on a substrate, forming an encapsulation layer including at least one inorganic layer and at least one organic layer on the light emitting layer, forming a plurality of organic patterns on the encapsulation layer, forming a preliminary light blocking pattern on the encapsulation layer to fill between the plurality of organic patterns, forming a first hard mask on each of the plurality of organic patterns, and forming a plurality of light blocking patterns by leaving portions of the preliminary light blocking pattern overlapping the first hard mask through a dry etching process.

In an embodiment, the forming of the plurality of organic patterns may include: forming an organic film on the encapsulation layer and forming the plurality of organic patterns by removing portions of the organic film through a photolithography process.

In an embodiment, the method may further include removing the first hard mask after the forming of the plurality of light blocking patterns.

In an embodiment, the first hard mask may be formed of or include metal.

In an embodiment, the forming of the plurality of organic patterns may include forming an organic film on the encapsulation layer, forming a plurality of second hard masks on the organic layer, and forming the plurality of organic patterns by leaving portions of the organic film overlapping the second hard masks through a dry etching process.

In an embodiment, the method may further include removing the plurality of second hard masks after the forming the plurality of organic patterns.

In an embodiment, the method may further include forming an organic film covering the plurality of light blocking patterns on the encapsulation layer and forming a light transmitting layer by combining the organic film with the plurality of organic patterns.

In an embodiment, each of the plurality of organic patterns may be formed using a positive photosensitive material or a negative photosensitive material.

In an embodiment, when each of the plurality of organic patterns is formed using a positive photosensitive material, each of the plurality of organic patterns may have a trapezoidal shape in a cross section.

In an embodiment, when each of the plurality of organic patterns is formed using a negative photosensitive material, each of the plurality of organic patterns may have a rectangular shape in a cross section.

In an embodiment, the preliminary light blocking pattern may be formed using molybdenum-tantalum oxide ("MTO") or an organic material including a black pigment.

A display device according to an embodiment of the present disclosure may include a plurality of light blocking patterns that control a viewing angle without including a separate light blocking film for controlling a viewing angle. Accordingly, a thickness of the display device may be effectively reduced, and the manufacturing cost of the display device may be reduced.

In addition, in a method of manufacturing the display device according to an embodiment of the present disclosure, a plurality of organic patterns may formed on a substrate, a preliminary light blocking pattern filling between the plurality of organic patterns may formed, a hard mask may be formed on the plurality of organic patterns to partially overlap the preliminary light blocking pattern, and the preliminary light blocking pattern overlapping the hard mask may remain so that a plurality of light blocking patterns is formed through a dry etching process. Accordingly, the plurality of light blocking patterns having a desired width and height may be formed.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
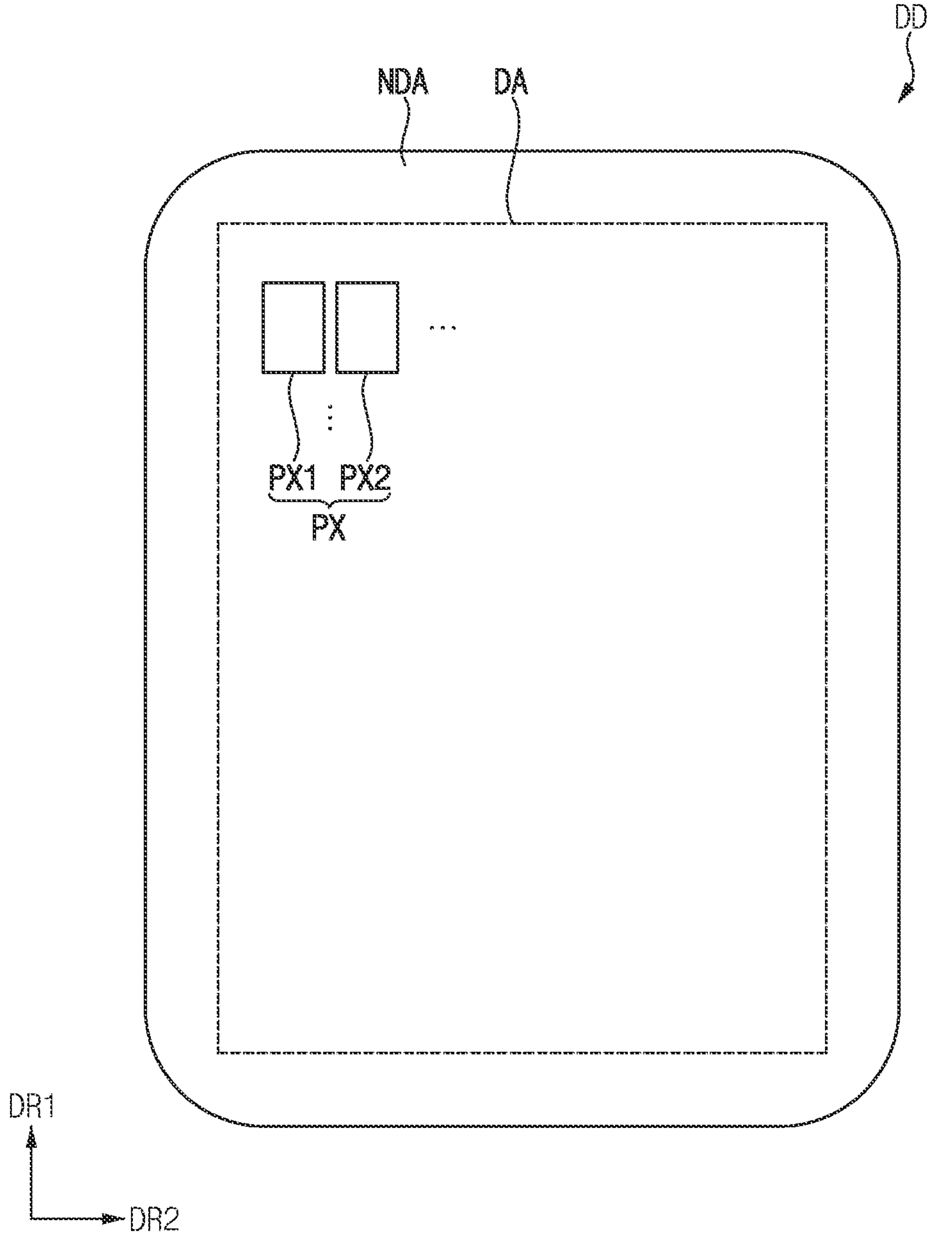
FIG. 1 is a plan view illustrating a display device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Hereinafter, a display device according to embodiments of the present disclosure will be explained in detail with reference to the accompanying drawings. The same reference numerals are used for the same components in the drawings, and redundant descriptions of the same components will be omitted.

FIG. 1 is a plan view illustrating a display device according to an embodiment. As used herein, the "plan view" is a view in a thickness direction of the display device.

Referring to FIG. 1, a display device DD according to an embodiment may include a display area DA and a non-display area NDA.

A plurality of pixels PX may be disposed in the display area DA. Each of the plurality of pixels PX may emit light. The plurality of pixels PX may include a first pixel PX1 and a second pixel PX2. For example, the first pixel PX1 and the second pixel PX2 may simultaneously emit light. Alternatively, when the first pixel PX1 emits light, the second pixel PX2 may not emit light. Alternatively, when the first pixel PX1 does not emit light, the second pixel PX2 may emit light. As each of the plurality of pixels PX emits light, the display area DA may display an image.

The plurality of pixels PX may be repeatedly arranged along a first direction DR1 and a second direction DR2 crossing the first direction DR1 in a plan view. For example, the second pixel PX2 may be adjacent to the first pixel PX1. Specifically, the second pixel PX2 may be adjacent to the first pixel PX1 in the second direction DR2.

The non-display area NDA may be located around the display area DA. For example, the non-display area NDA may surround at least a portion of the display area DA. A driver may be disposed in the non-display area NDA. The driver may provide signals and/or voltages to the plurality of pixels PX. For example, the driver may include a data driver, a gate driver, and the like. The non-display area NDA may not display an image.

In this specification, a plane may be defined as the first direction DR1 and the second direction DR2. For example, the first direction DR1 may be perpendicular to the second direction DR2.

The display device DD of the present disclosure may include an organic light emitting display device ("OLED"), a liquid crystal display device ("LCD"), a field emission display device ("FED"), a plasma display device ("PDP"), an electrophoretic display device ("EPD"), or an inorganic light emitting display device ("ILED").

Figure 2:
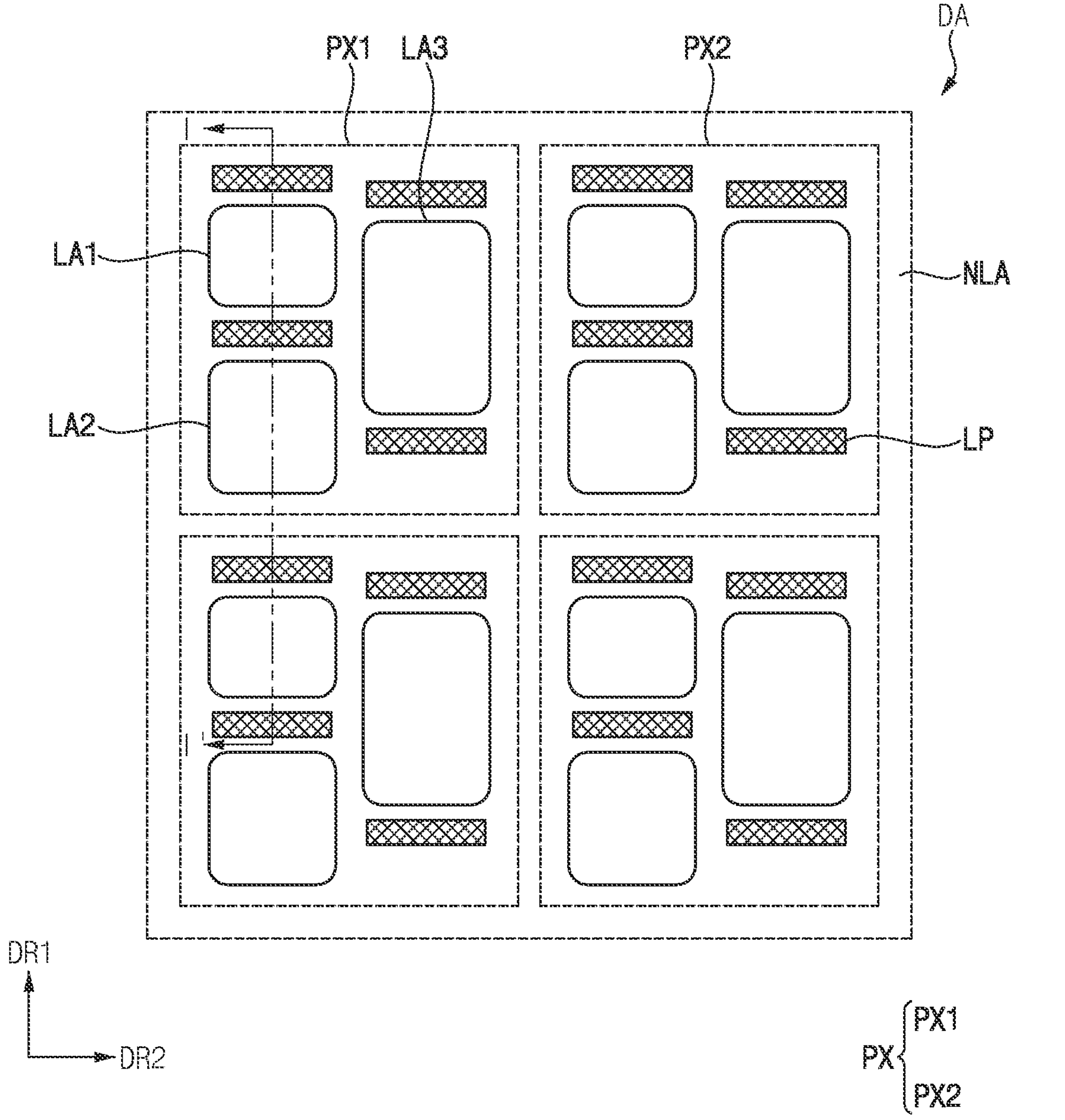
FIG. 2 is an enlarged plan view of a portion of the display area of the display device of FIG. 1.

FIG. 2 is an enlarged plan view of a portion of the display area of the display device of FIG. 1.

Referring to FIGS. 1 and 2, as described above, the display device DD may include the display area DA and the non-display area NDA, and the plurality of pixels PX may be disposed in the display area DA. The plurality of pixels PX may include the first pixel PX1 and the second pixel PX2.

Each of the first pixel PX1 and the second pixel PX2 may include a first light emitting area LA1, a second light emitting area LA2, a third light emitting area LA3, and a non-light emitting area NLA.

The first light emitting area LA1 may emit light of a first color, the second light emitting area LA2 may emit light of a second color, and the third light emitting area LA3 may emit light of a third color. In an embodiment, the first color may be red, the second color may be green, and the third color may be blue. As the light of the first color, the light of the second color, and the light of the third color are combined, each of the first pixel PX1 and the second pixel PX2 may emit light of various colors. The non-light emitting area NLA may not emit light.

In an embodiment, the display device DD may include a plurality of light blocking patterns LP. Each of the plurality of light blocking patterns LP may overlap the non-light emitting area NLA in a plan view. However, each of the plurality of light blocking patterns LP may not overlap the first light emitting area LA1, the second light emitting area LA2, and the third light emitting area LA3 in a plan view.

Figure 3:
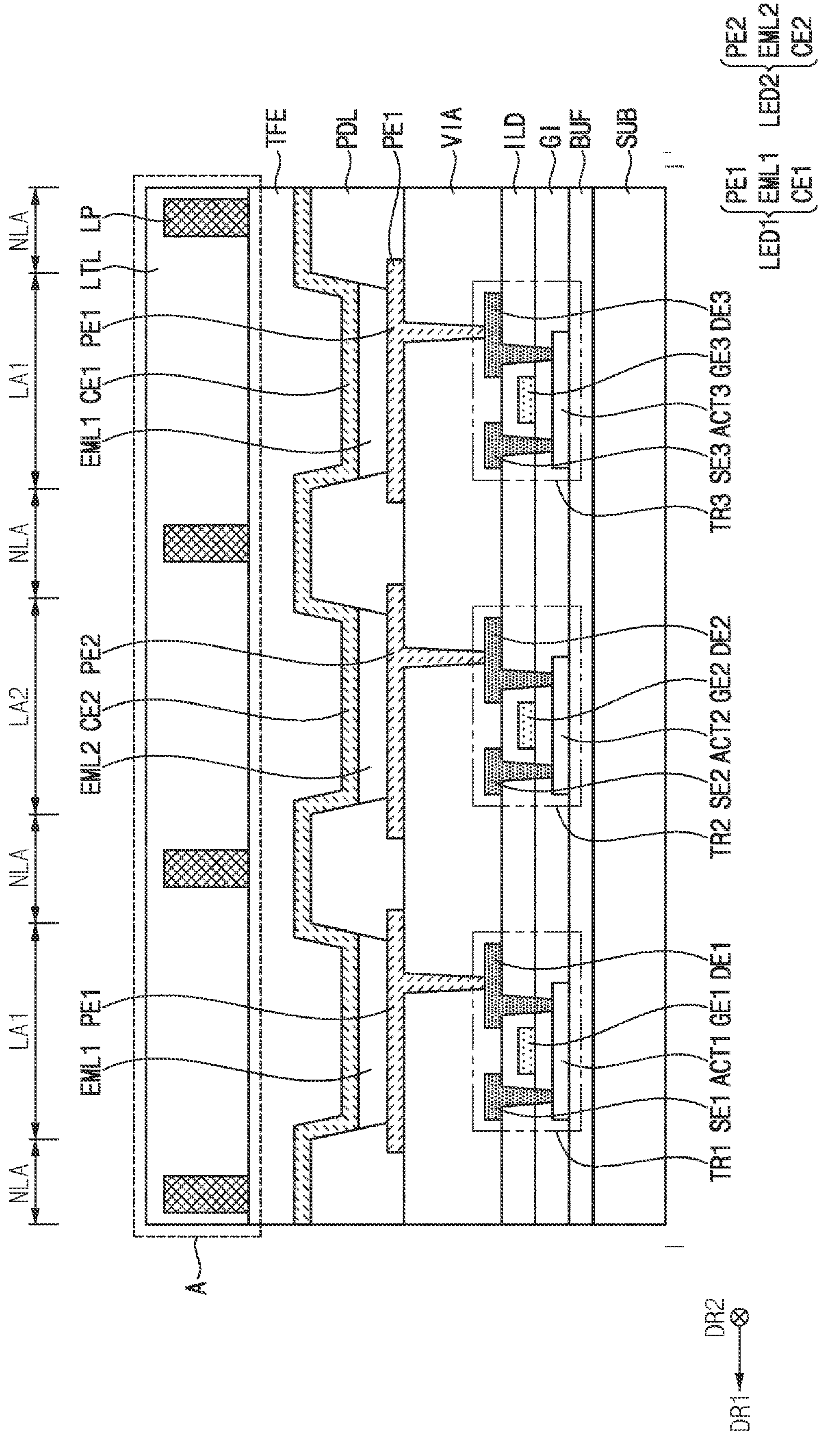
FIG. 3 is a cross-sectional view taken along line I-I' of FIG. 2.
Figure 4:
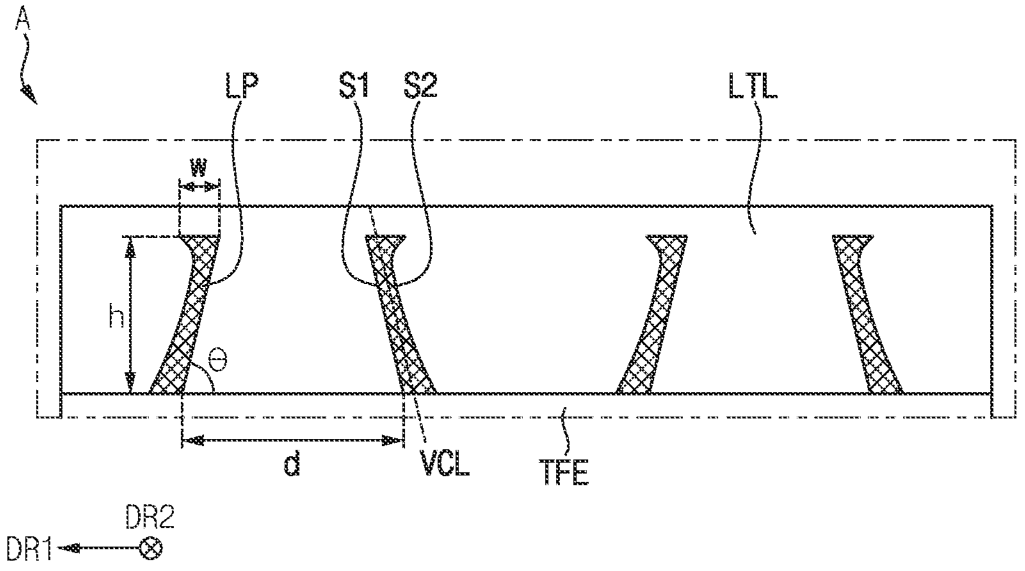
FIG. 4 is an enlarged cross-sectional view of an example of area A of FIG. 3.
Figure 5:
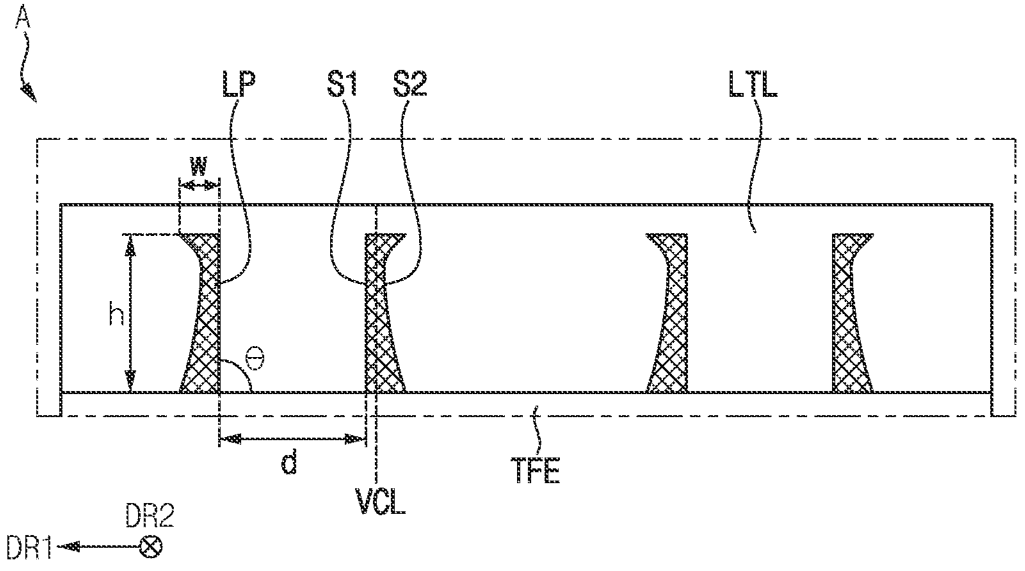
FIG. 5 is an enlarged cross-sectional view of another example of area A of FIG. 3.

FIG. 3 is a cross-sectional view taken along line I-I' of FIG. 2. FIG. 4 is an enlarged cross-sectional view of an example of area A of FIG. 3. FIG. 5 is an enlarged cross-sectional view of another example of area A of FIG. 3.

Referring to FIGS. 3, 4, and 5, the display device DD according to an embodiment may include a substrate SUB, a buffer layer BUF, first, second, and third transistors TR1, TR2, and TR3, a gate insulating layer GI, an interlayer insulating layer ILD, a via insulating layer VIA, a pixel defining layer PDL, first and second light emitting elements LED1 and LED2, an encapsulation layer TFE, a plurality of light blocking patterns LP, and a light transmitting layer LTL.

Here, the first transistor TR1 may include a first active pattern ACT1, a first gate electrode GE1, a first source electrode SE1, and a first drain electrode DE1. The second transistor TR2 may include a second active pattern ACT2, a second gate electrode GE2, a second source electrode SE2, and a second drain electrode DE2. The third transistor TR3 may include a third active pattern ACT3, a third gate electrode GE3, a third source electrode SE3, and a third drain electrode DE3.

In addition, the first light emitting element LED1 may include a first pixel electrode PE1, a first light emitting layer EML1, and a first common electrode CE1. The second light emitting element LED2 may include a second pixel electrode PE2, a second light emitting layer EML2, and a second common electrode CE2.

The substrate SUB may include a transparent material or an opaque material. The substrate SUB may be made of a transparent resin substrate. Examples of the transparent resin substrate include polyimide substrates and the like. In this case, the polyimide substrate may include a first organic layer, a first barrier layer, a second organic layer, and the like. Optionally, the substrate SUB may include a quartz substrate, a synthetic quartz substrate, a calcium fluoride substrate, an F-doped quartz substrate, a soda-lime glass substrate, a non-alkali glass substrate, and the like. These may be used alone or in combination with each other.

The buffer layer BUF may be disposed on the substrate SUB. The buffer layer BUF may prevent diffusion of metal atoms or impurities from the substrate SUB into the first, second, and third transistors TR1, TR2, and TR3. In addition, the buffer layer BUF may improve flatness of the surface of the substrate SUB when the surface of the substrate SUB is not uniform. For example, the buffer layer BUF may include an inorganic material such as silicon oxide, silicon nitride, silicon oxynitride, and the like. These may be used alone or in combination with each other.

The first, second, and third active patterns ACT1, ACT2, and ACT3 may be disposed on the buffer layer BUF. Each of the first, second, and third active patterns ACT1, ACT2, and ACT3 may include a metal oxide semiconductor, an inorganic semiconductor (e.g., amorphous silicon, and poly silicon), or an organic semiconductor. Each of the first, second, and third active patterns ACT1, ACT2, and ACT3 may include a source region, a drain region, and a channel region positioned between the source region and the drain region. The first, second, and third active patterns ACT1, ACT2, and ACT3 may be formed through the same process and include the same material.

The metal oxide semiconductor may include a two-component compound ("$AB_x$"), a ternary compound ("$AB_xC_y$"), a four-component compound ("$AB_xC_yD_z$"), and the like containing indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like. For example, the metal oxide semiconductor may be zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide. ("ITO"), indium zinc tin oxide ("IZTO"), indium gallium zinc oxide ("IGZO"), and the like. These may be used alone or in combination with each other.

The gate insulating layer GI may be disposed on the buffer layer BUF. The gate insulating layer GI may sufficiently cover the first, second, and third active patterns ACT1, ACT2, and ACT3, and may have a substantially flat upper surface without creating a step around the first, second, and third active patterns ACT1, ACT2, and ACT3. Alternatively, the gate insulating layer GI may cover the first, second, and third active patterns ACT1, ACT2, and ACT3 and may be disposed along the profile of each of the first, second, and third active patterns ACT1, ACT2, and ACT3 to have a uniform thickness. For example, the gate insulating layer GI may include an inorganic material such as silicon oxide ("$SiO_x$), silicon nitride ("$SiN_x$"), silicon carbide ("$SiC_x$"), silicon oxynitride ("$SiO_xN_y$"), silicon oxycarbide ("$SiO_xC_y$"), and the like. These may be used alone or in combination with each other.

The first, second, and third gate electrodes GE1, GE2, and GE3 may be disposed on the gate insulating layer GI. The first gate electrode GE1 may overlap the channel region of the first active pattern ACT1, the second gate electrode GE2 may overlap the channel region of the second active pattern ACT2, and the third gate electrode GE3 may overlap the channel region of the third active pattern ACT3 in a plan view.

Each of the first, second, and third gate electrodes GE1, GE2, and GE3 may include a metal, an alloy metal nitride, a conductive metal oxide, a transparent conductive material, and the like. Examples of the metal may include silver ("Ag"), molybdenum ("Mo"), aluminum ("Al"), tungsten ("W"), copper ("Cu"), nickel ("Ni"), chromium ("Cr"), titanium ("Ti"), tantalum ("Ta"), platinum ("Pt"), scandium ("Sc"), and the like. Examples of the conductive metal oxide may include indium tin oxide and indium zinc oxide. In addition, examples of the metal nitride may include aluminum nitride ("$AlN_x$"), tungsten nitride ("$WN_x$"), and chromium nitride ("$CrN_x$"). These may be used individually or in combination with each other.

The first, second, and third gate electrodes GE1, GE2, and GE3 may be formed through the same process and include the same material.

The interlayer insulating layer ILD may be disposed on the gate insulating layer GI. The interlayer insulating layer ILD may sufficiently cover the first, second, and third gate electrodes GE1, GE2, and GE3, and may have a substantially flat upper surface without creating a step around first, second, and third gate electrodes GE1, GE2, and GE3. Alternatively, the interlayer insulating layer ILD covers the first, second, and third gate electrodes GE1, GE2, and GE3 and may be disposed along the profile of each of the first, second, and third gate electrodes GE1, GE2, and GE3 to have a uniform thickness. For example, the interlayer insulating layer ILD may include an inorganic material such as silicon oxide, silicon nitride, silicon carbide, silicon oxynitride, silicon oxycarbide, and the like. These may be used alone or in combination with each other.

The first, second, and third source electrodes SE1, SE2, and SE3 may be disposed on the interlayer insulating layer ILD. The first source electrode SE1 may be connected to the source region of the first active pattern ACT1 through a contact hole penetrating the gate insulating layer GI and the interlayer insulating layer ILD. The second source electrode SE2 may be connected to the source region of the second active pattern ACT2 through a contact hole penetrating the gate insulating layer GI and the interlayer insulating layer ILD. The third source electrode SE3 may be connected to the source region of the third active pattern ACT3 through a contact hole penetrating the gate insulating layer GI and the interlayer insulating layer ILD.

The first, second, and third drain electrodes DE1, DE2, and DE3 may be disposed on the interlayer insulating layer ILD. The first drain electrode DE1 may be connected to the drain region of the first active pattern ACT1 through a contact hole penetrating the gate insulating layer GI and the interlayer insulating layer ILD. The second drain electrode DE2 may be connected to the drain region of the second active pattern ACT2 through a contact hole penetrating the gate insulating layer GI and the interlayer insulating layer ILD. The third drain electrode DE3 may be connected to the drain region of the third active pattern ACT3 through a contact hole penetrating the gate insulating layer GI and the interlayer insulating layer ILD.

For example, each of the first, second, and third source electrodes SE1, SE2, and SE3 may include a metal, an alloy, a metal nitride, a conductive metal oxide, a transparent conductive material, and the like. These may be used alone or in combination with each other. The first, second, and third drain electrodes DE1, DE2, and DE3 may be formed through the same process as the first, second, and third source electrodes SE1, SE2, and SE3 and may include the same material.

Accordingly, the first transistor TR1 including the first active pattern ACT1, the first gate electrode GE1, the first source electrode SE1, and the first drain electrode DE1 may be disposed on the substrate SUB. The second transistor TR2 including the second active pattern ACT2, the second gate electrode GE2, the second source electrode SE2, and the second drain electrode DE2 may be disposed on the substrate SUB. The third transistor TR3 including the third active pattern ACT3, the third gate electrode GE3, the third source electrode SE3, and the third drain electrode DE3 may be disposed on the substrate SUB.

The via insulating layer VIA may be disposed on the interlayer insulation layer ILD. The via insulating layer VIA may sufficiently cover the first, second, and third source electrodes SE1, SE2, and SE3 and the first, second, and third drain electrodes DE1, DE2, and DE3. The via insulating layer VIA may include an organic material. For example, the via insulating layer VIA may be made of phenolic resin, polyacrylates resin, polyimides rein, polyamides resin, siloxane resin, epoxy resin, and the like. These may be used alone or in combination with each other.

The first and second pixel electrodes PE1 and PE2 may be disposed on the via insulating layer VIA. The first pixel electrodes PE1 may overlap the first light emitting area LA1, and the second pixel electrode PE2 may overlap the second light emitting area LA2 in a plan view. Each of the first pixel electrodes PE1 may be connected to each of the first and third drain electrodes DE1 an DE3 through a contact hole penetrating the via insulating layer VIA. The second pixel electrode PE2 may be connected to the second drain electrode DE2 through a contact hole penetrating the via insulating layer VIA.

For example, each of the first and second pixel electrodes PE1 and PE2 may include a metal, an alloy, a metal nitride, a conductive metal oxide, a transparent conductive material, and the like. These may be used alone or in combination with each other. In an embodiment, each of the first and second pixel electrodes PE1 and PE2 may have a stacked structure including ITO/Ag/ITO. The first and second pixel electrodes PE1 and PE2 may be formed through the same process and include the same material. For example, each of the first and second pixel electrodes PE1 and PE2 may function as an anode.

The pixel defining layer PDL may be disposed on the via insulating layer VIA. The pixel defining layer PDL may overlap the non-light emitting area NLA in a plan view. The pixel defining layer PDL may cover opposite side portions of each of the first and second pixel electrodes PE1 and PE2. In addition, an opening may be defined in the pixel defining layer PDL to expose a portion of an upper surface of each of the first and second pixel electrodes PE1 and PE2. For example, the pixel defining layer PDL may include an inorganic material or an organic material. In an embodiment, the pixel defining layer PDL may include an organic material such as an epoxy resin, a siloxane resin, and the like. These may be used alone or in combination with each other. In another embodiment, the pixel defining layer PDL may further include a light blocking material containing a black pigment or black dye.

The first light emitting layer EML1 may be disposed on the first pixel electrode PE1, and the second light emitting layer EML2 may be disposed on the second pixel electrode PE2. Each of the first and second light emitting layers EML1 and EML2 may include an organic material emitting light of a preset color. For example, the first light emitting layer EML1 may include an organic material emitting red light, and the second light emitting layer EML2 may include an organic material emitting green light.

The first common electrode CE1 may be disposed on the first light emitting layer EML1 and the pixel defining layer PDL, and the second common electrode CE2 may be disposed on the second light emitting layer EML2 and the pixel defining layer PDL. The first and second common electrodes CE1 and CE2 may be integrally formed. For example, each of the first and second common electrodes CE1 and CE2 may include a metal, an alloy, a metal nitride, a conductive metal oxide, a transparent conductive material, and the like. These may be used alone or in combination with each other. The first and second common electrodes CE1 and CE2 may operate as cathodes.

Accordingly, the first light emitting element LED1 including the first pixel electrode PE1, the first light emitting layer EML1, and the first common electrode CE1 may be disposed in the first light emitting area LA1 on the substrate SUB. The second light emitting element LED2 including the second pixel electrode PE2, the second light emitting layer EML2, and the second common electrode CE2 may be disposed in the second light emitting area LA2 on the substrate SUB.

The encapsulation layer TFE may be disposed on the first and second common electrodes CE1 and CE2. The encapsulation layer TFE may prevent impurities, moisture, outside air, and the like from permeating the first and second light emitting elements LED1 and LED2 from the outside. The encapsulation layer TFE may include at least one inorganic layer and at least one organic layer. For example, the inorganic layer may include silicon oxide, silicon nitride, silicon oxynitride, and the like. These may be used alone or in combination with each other. The organic layer may include a polymer cured material such as polyacrylate.

The plurality of light blocking patterns LP may be disposed on the encapsulation layer TFE. The plurality of light blocking patterns LP may be spaced apart from each other. Each of the plurality of light blocking patterns LP may overlap the non-light emitting area NLA in a plan view.

Light emitted from the light emitting elements LED1 and LED2 may be incident on the plurality of light blocking patterns LP or may pass between the plurality of light blocking patterns LP. Light incident on the plurality of light blocking patterns LP may be reflected by the plurality of light blocking patterns LP, transmitted through the plurality of light blocking patterns LP, or absorbed by the plurality of light blocking patterns LP. In an embodiment, most of the light incident on the plurality of light blocking patterns LP may be absorbed by the plurality of light blocking patterns LP. Accordingly, the plurality of light blocking patterns LP may control the viewing angle of the display device DD.

In an embodiment, each of the plurality of light blocking patterns LP may include molybdenum-tantalum oxide ("MTO"). Each of the plurality of light blocking patterns LP may have a multilayer structure. For example, each of the plurality of light blocking patterns LP may have an MTO single layer structure. Alternatively, the plurality of light blocking patterns LP may have a double layer structure including MTO/Mo, MTO/Cu, MTO/Al, and the like. Alternatively, each of the plurality of light blocking patterns LP may have a triple layer structure including MTO/Mo/MTO, MTO/Cu/MTO, MTO/Al/MTO, and the like. These may be used individually or in combination with each other. However, each of the plurality of light blocking patterns LP is not limited to including MTO, and the plurality of light blocking patterns LP may include various materials having relatively low transmittance and reflectance and relatively high absorbance. In another embodiment, each of the plurality of light blocking patterns LP may include an organic material including a black pigment.

In an embodiment, each of the plurality of light blocking patterns LP may have an asymmetrical shape with respect to a virtual center line VCL. For example, each of the plurality of light blocking patterns LP may include a first side surface S1 and a second side surface S2 facing the first side surface S1. In an embodiment, the first side surface S1 may be flat, and the second side surface S2 may be bent such that one side is round.

The height h of each of the plurality of light blocking patterns LP may be substantially the same. In addition, the distance d between the plurality of light blocking patterns LP may be substantially the same.

For example, a value obtained by dividing the height h of each of the plurality of light blocking patterns LP by the distance d between the plurality of light blocking patterns LP may be equal to or greater than about 2.83. In addition, a value obtained by dividing the average width w of each of the plurality of light blocking patterns LP by the distance d between the plurality of light blocking patterns LP may be about 0.25 or less. When the relationship between the height h of each of the plurality of light blocking patterns LP, the average width w of each of the plurality of light blocking patterns LP, and the distance d between the plurality of light blocking patterns LP has been described above satisfies the aforementioned numerical range, a desired luminance may be obtained at a desired viewing angle.

An angle θ formed by each of the plurality of light blocking patterns LP and the encapsulation layer TFE may be an acute angle (see FIG. 4). Optionally, an angle θ formed between each of the plurality of light blocking patterns LP and the encapsulation layer TFE may be a right angle (see FIG. 5).

The light transmitting layer LTL may be disposed on the encapsulation layer TFE. Light emitted from the light emitting elements LED1 and LED2 may pass through the light transmitting layer LTL. The light transmitting layer LTL may have a substantially flat upper surface. The light transmitting layer LTL may sufficiently cover the plurality of light blocking patterns LP. That is, the upper surface of the light transmitting layer LTL may be positioned at a higher level than the upper surface of the plurality of light blocking patterns LP. Alternatively, the upper surface of the light transmitting layer LTL may be positioned at the same level as the upper surface of the plurality of light blocking patterns LP.

In an embodiment, the light transmitting layer LTL may include a transparent organic material. For example, the light transmitting layer LTL may include a transparent organic material such as an epoxy resin, a siloxane resin, a polyimide resin, a photoresist, and the like. These may be used alone or in combination with each other.

FIGS. 6, 7, 8, 9, 10, 11, 12, and 13 are cross-sectional views illustrating an example of a manufacturing method of the display device of FIG. 3. Specifically, FIGS. 6, 7, 8, 9, 10, 11, 12, and 13 are cross-sectional views illustrating an example of a method of manufacturing the plurality of light blocking patterns LP included in the display device DD of FIG. 3.

Figure 6:
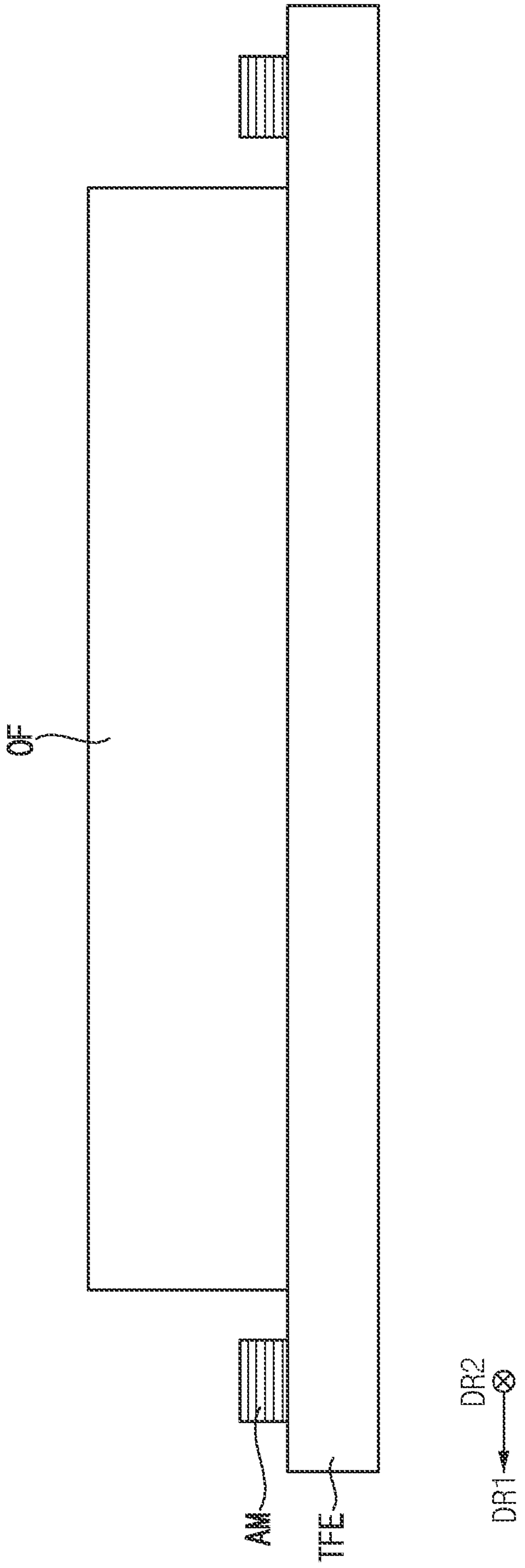
FIGS. 6, 7, 8, 9, 10, 11, 12, and 13 are cross-sectional views illustrating an example of a manufacturing method of the display device of FIG. 3.

Referring to FIGS. 3 and 6, the buffer layer BUF, the first, second, and third active patterns ACT1, ACT2, and ACT3, the gate insulating layer GI, the first, second, and third gate electrodes GE1, GE1, and GE3, the interlayer insulating layer ILD, the first, second, and third source electrodes SE1, SE2, and SE3, the first, second, and third drain electrodes DE1, DE2, and DE3, the via insulation layer VIA, the first and second pixel electrodes PE1 and PE2, the pixel defining layer PDL, the first and second light emitting layers EML1 and EML2, the first and second common electrodes CE1 and CE2, and the encapsulation layer TFE may be sequentially formed.

Align mark AM may be formed on the encapsulation layer TFE. The align mark AM may be used as an identification mark for align in a process of forming the plurality of light blocking patterns LP, which will be described later.

An organic film OF may be formed on the encapsulation layer TFE. For example, the organic film OF may be formed using a transparent organic material. In an embodiment, the organic film OF may be formed using a transparent photosensitive organic material.

Figure 7:
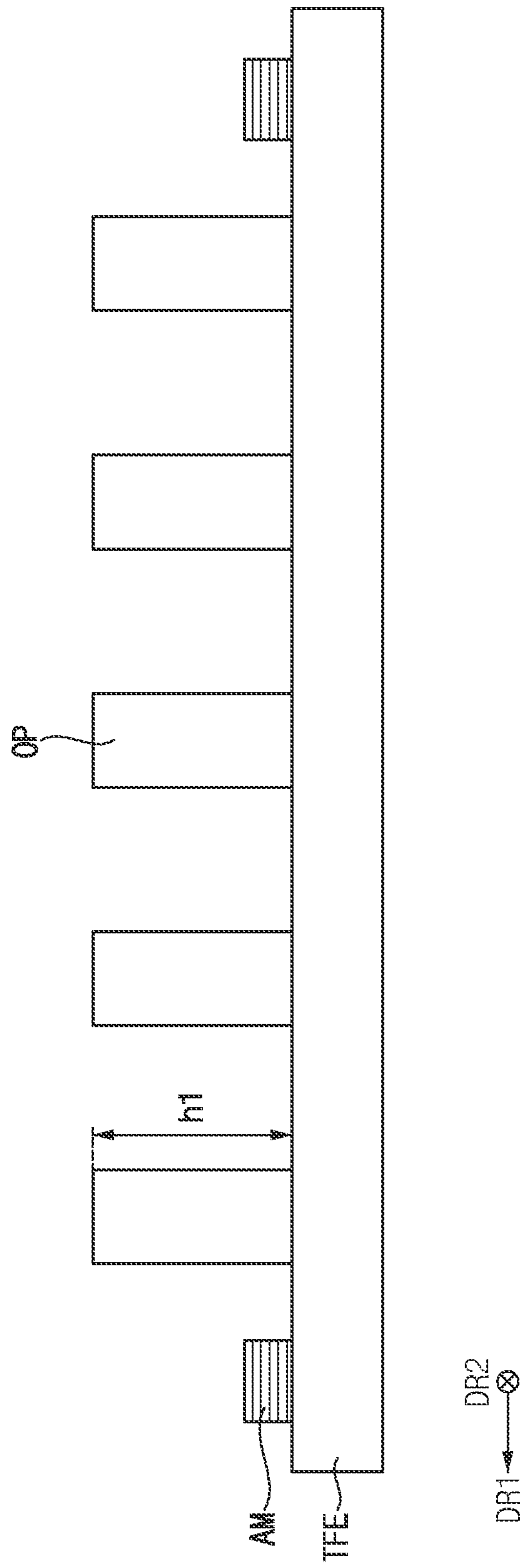
Figure 8:
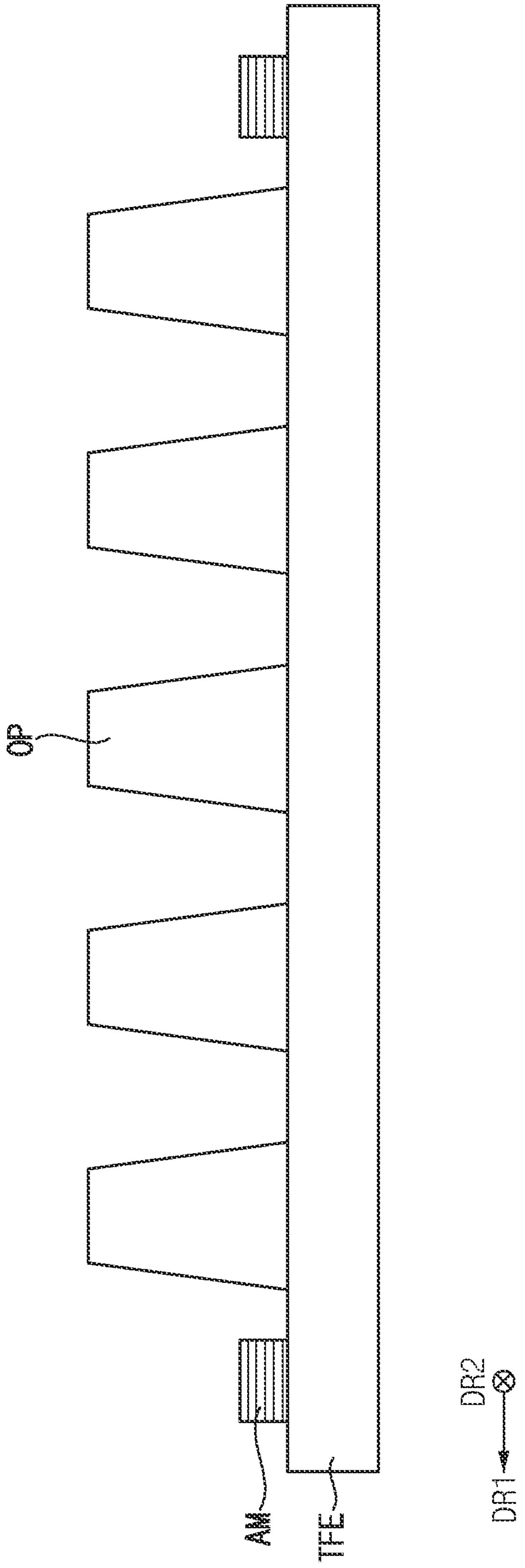

Referring to FIGS. 7 and 8, a plurality of organic patterns OP may be formed by removing a portion of the organic film OF through a photolithography process. For example, in this case, each of the plurality of organic patterns OP may be formed to have a height h1 of about 10 micrometers.

In an embodiment, as shown in FIG. 7, each of the plurality of organic patterns OP may have a rectangular shape in a cross section. As used herein, the "cross section" is a cross sectional view in the second direction DR2. In this case, each of the plurality of organic patterns OP may be formed using a negative photosensitive material. In another embodiment, as shown in FIG. 8, each of the plurality of organic patterns OP may have a trapezoidal shape in a cross section. In this case, each of the plurality of organic patterns OP may be formed using a positive photosensitive material.

Figure 9:
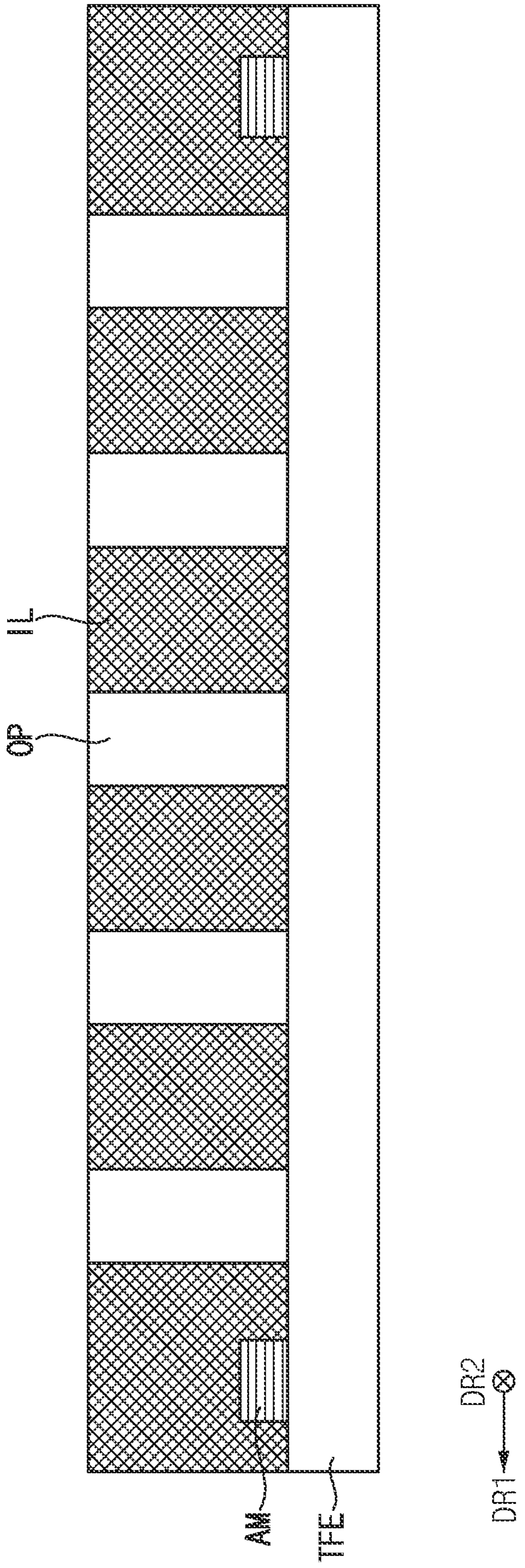

Referring to FIG. 9, a preliminary light blocking pattern IL may be formed on the encapsulation layer TFT. For example, the preliminary light blocking pattern IL may be formed using MTO or an organic material including a black pigment. The preliminary light blocking pattern IL may fill between the plurality of organic patterns OP In this case, the upper surface of the preliminary light blocking pattern IL may be positioned at the same level as the upper surface of each of the plurality of organic patterns OP.

Figure 10:
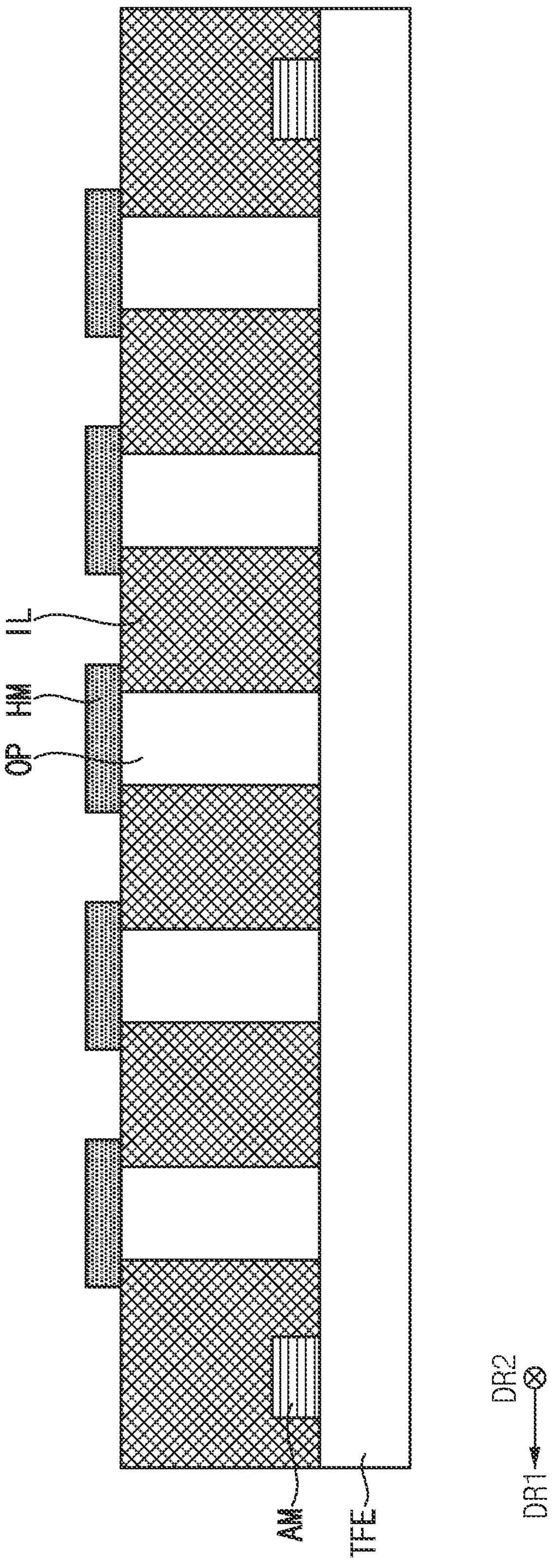

Referring to FIG. 10, a hard mask HM may be formed on each of the plurality of organic patterns OP. In detail, the hard mask HM may be formed to partially overlap the preliminary light blocking pattern IL in a plan view. For example, the hard mask HM may be formed using metal.

Figure 11:
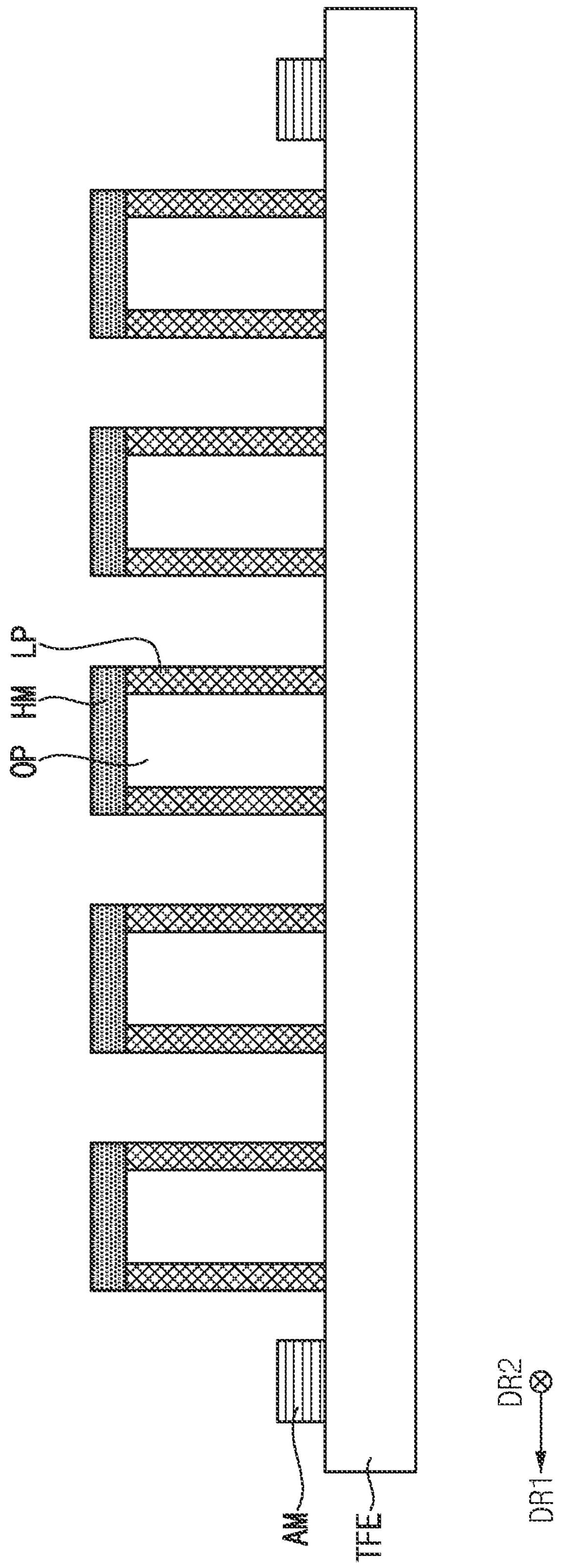

Referring to FIG. 11, in an embodiment, the plurality of light blocking patterns LP may be formed by removing a portion of the preliminary light blocking pattern IL through a dry etching process using the hard mask HM. That is, a portion of the preliminary blocking pattern IL overlapping the hard mask HM may remain to form a plurality of blocking patterns LP, and another portion of the preliminary blocking pattern IL that does not overlap the hard mask HM may be removed. Widths of the plurality of light blocking patterns LP in the second direction DR2 may be adjusted through the hard mask HM. Accordingly, the plurality of light blocking patterns LP having desired heights and widths may be formed through the hard mask HM.

Figure 12:
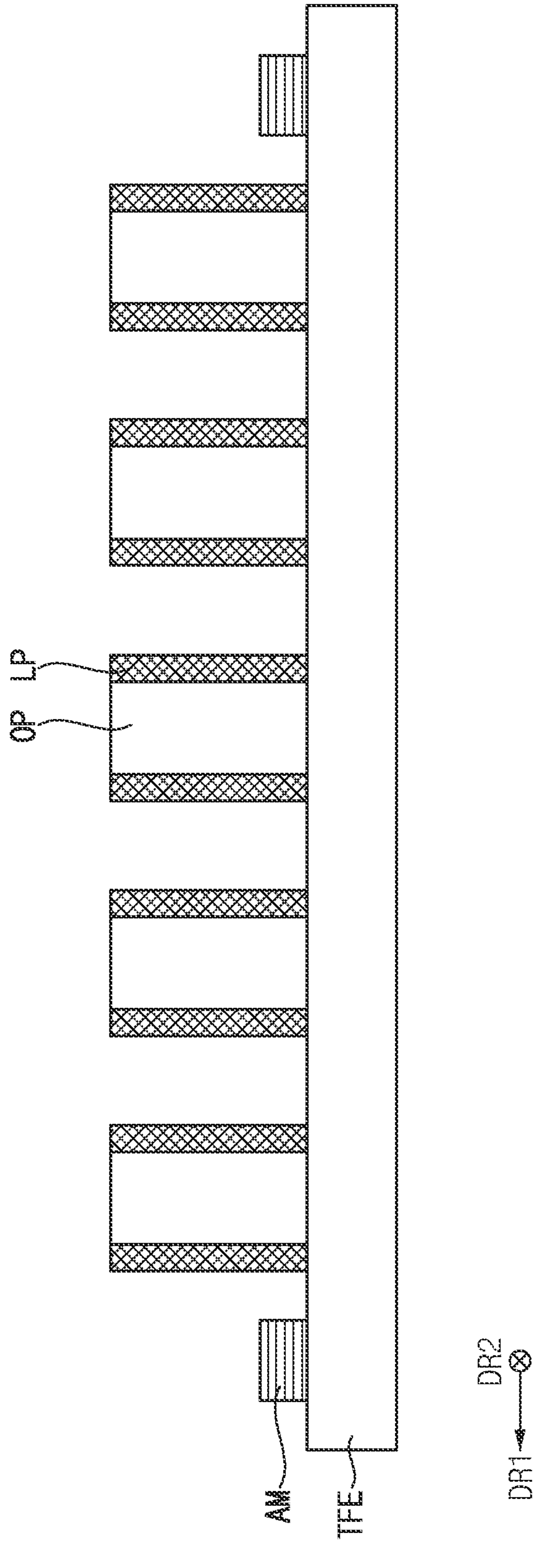

Referring to FIG. 12, after the plurality of light blocking patterns LP are formed, the hard mask HM may be removed. Alternatively, the hard mask HM may not be removed after the plurality of light blocking patterns LP are formed. In this case, the hard mask HM may be formed using a transparent conductive material.

Figure 13:
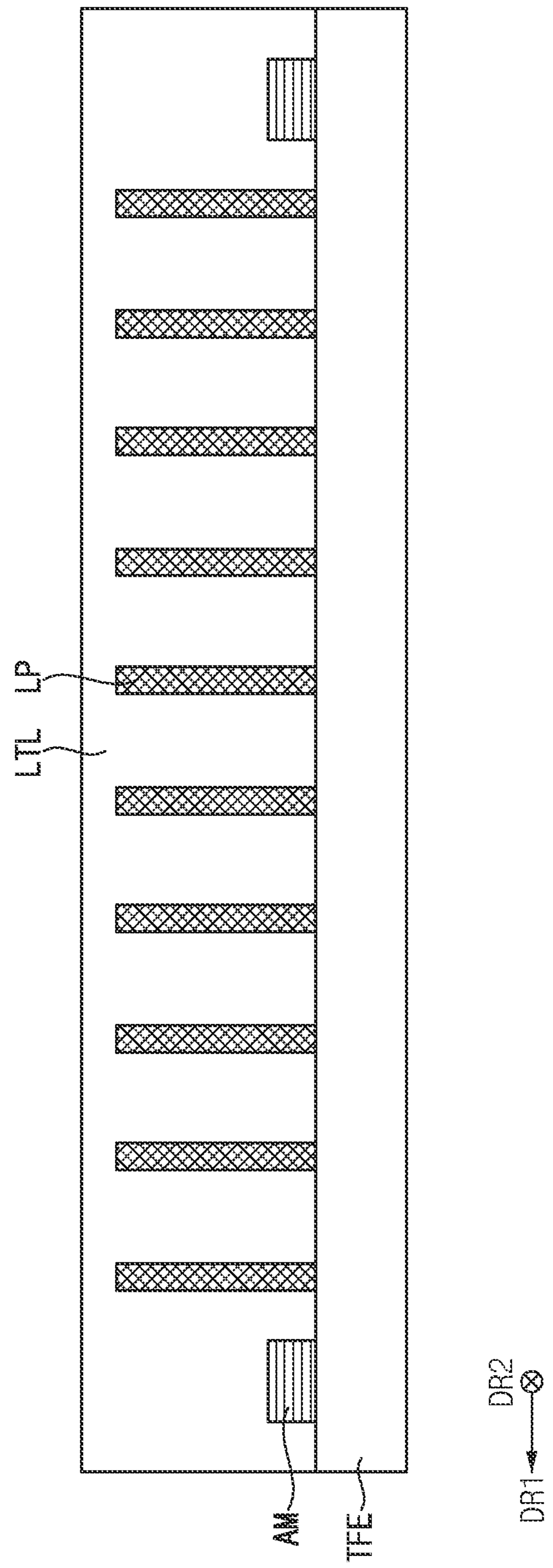

Referring to FIG. 13, more organic film may be added on the encapsulation layer TFE. For example, the organic film may include a transparent organic material. That is, the added organic film may include the same material as the plurality of organic patterns OP The organic film may fill between the plurality of light blocking patterns LP. In addition, the organic film may sufficiently cover the plurality of light blocking patterns LP and the plurality of organic patterns OP. Accordingly, when the organic film is combined with the plurality of organic patterns OP, the light transmitting layer LTL sufficiently covering the plurality of light blocking patterns LP may be formed.

Figure 14:
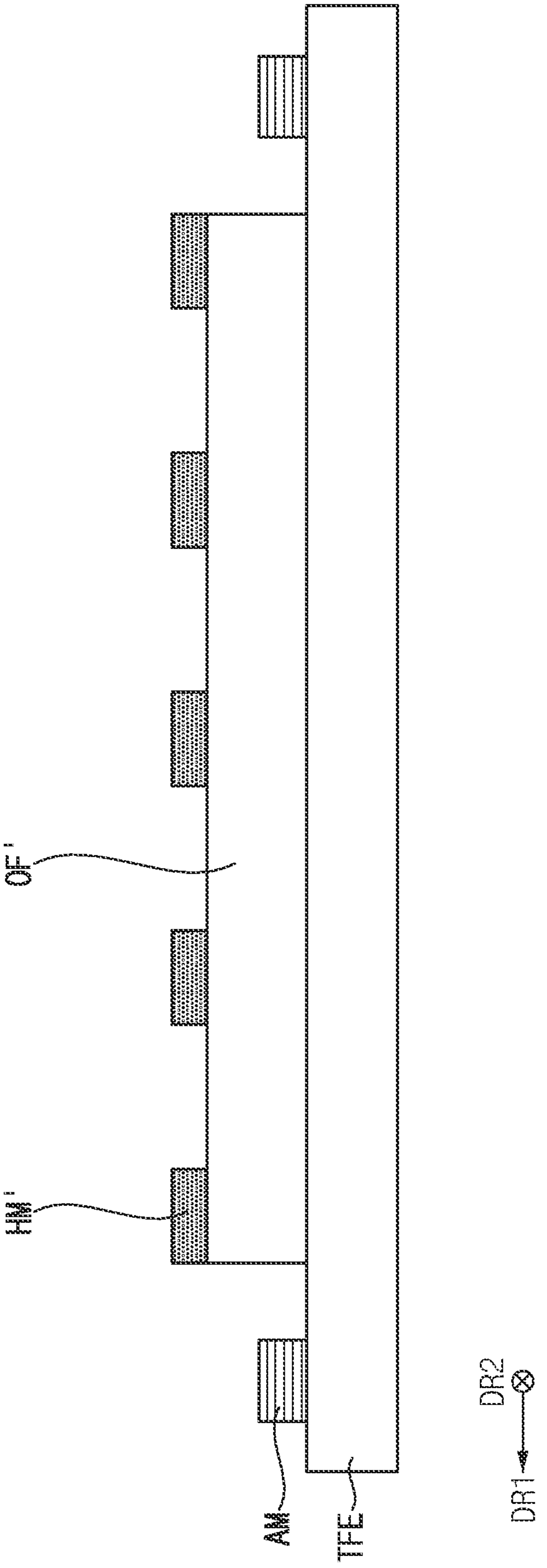
FIGS. 14 and 15 are cross-sectional views illustrating another example of a manufacturing method of the display device of FIG. 3.
Figure 15:
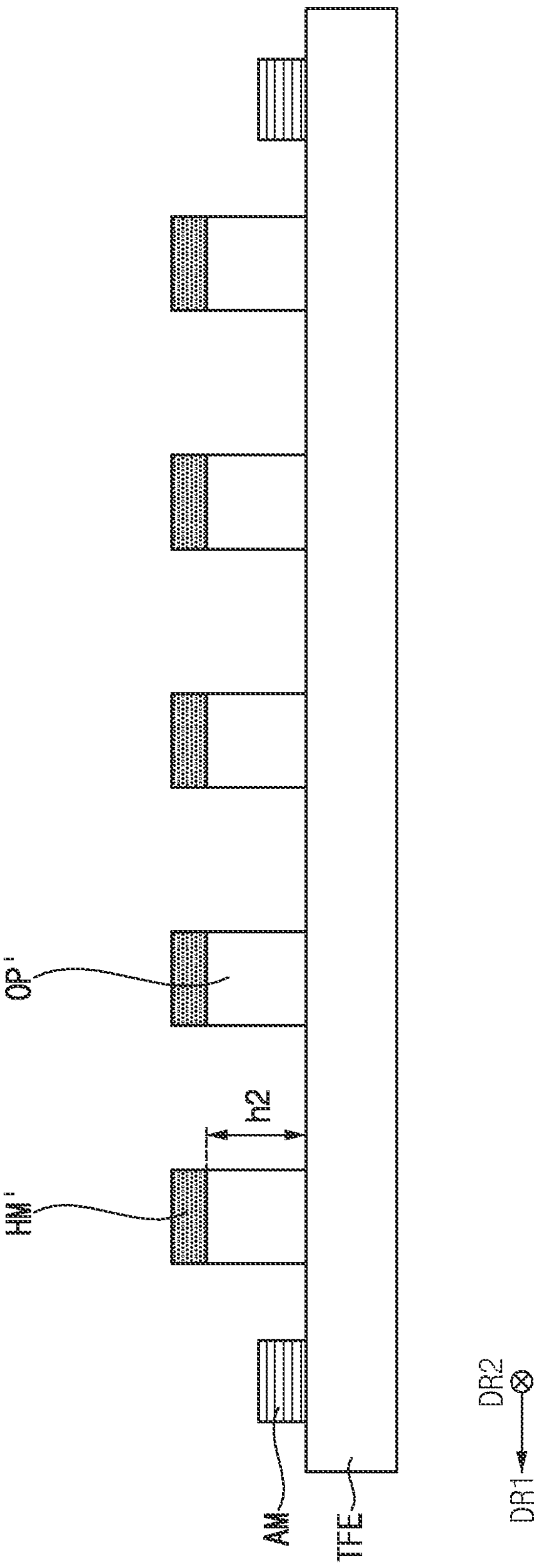

FIGS. 14 and 15 are cross-sectional views illustrating another example of a manufacturing method of the display device of FIG. 3. Specifically, FIGS. 14 and 15 are cross-sectional views illustrating another example of a method of manufacturing the plurality of light blocking patterns LP included in the display device DD of FIG. 3.

Hereinafter, descriptions overlapping with the manufacturing method of the light blocking patterns LP included in the display device DD described with reference to FIGS. 6, 7, 8, 9, 10, 11, 12, and 13 will be omitted or simplified.

Referring to FIG. 14, align mark AM may be formed on the encapsulation layer TFE. An organic film OF' may be formed on the encapsulation layer TFE. For example, the organic film OF' may be formed using a transparent organic material.

Hard masks HM' may be formed on the organic film OF'. The hard masks HM' may be spaced apart from each other. For example, each of the hard masks HM' may be formed using metal.

Referring to FIGS. 14 and 15, a plurality of organic patterns OP' may be formed by removing a portion of the organic film OF' through a dry etching process using hard masks HM'. That is, a portion of the organic film OF' overlapping the hard masks HM' in a plan view may remain to form the plurality of organic patterns OP', and another portion of the organic film OF' that does not overlapping the hard masks HM' may be removed. For example, each of the plurality of organic patterns OP' may be formed to have a thickness h2 of about 5 micrometers. After the plurality of organic patterns OP' are formed, the hard masks HM' may be removed.

Subsequent manufacturing processes may be substantially the same as manufacturing processes described with reference to FIGS. 9, 10, 11, 12, and 13.

That is, a preliminary light blocking pattern IL including MTO may be formed on the encapsulation layer TFE to fill between the plurality of organic patterns OP'.

Then, a plurality of light blocking patterns LP may be formed by removing a portion of the preliminary light blocking pattern IL through a dry etching process using a metal hard mask HM. After the light blocking patterns LP are formed, the hard mask HM may be removed.

Finally, additional organic film including the same material as the plurality of organic patterns OP' may be added on the encapsulation layer TFE to sufficiently cover the light blocking patterns LP. Accordingly, a light transmitting layer LTL sufficiently covering the light blocking patterns LP may be formed by combining the additional organic film with the plurality of organic patterns OP.

Figure 16:
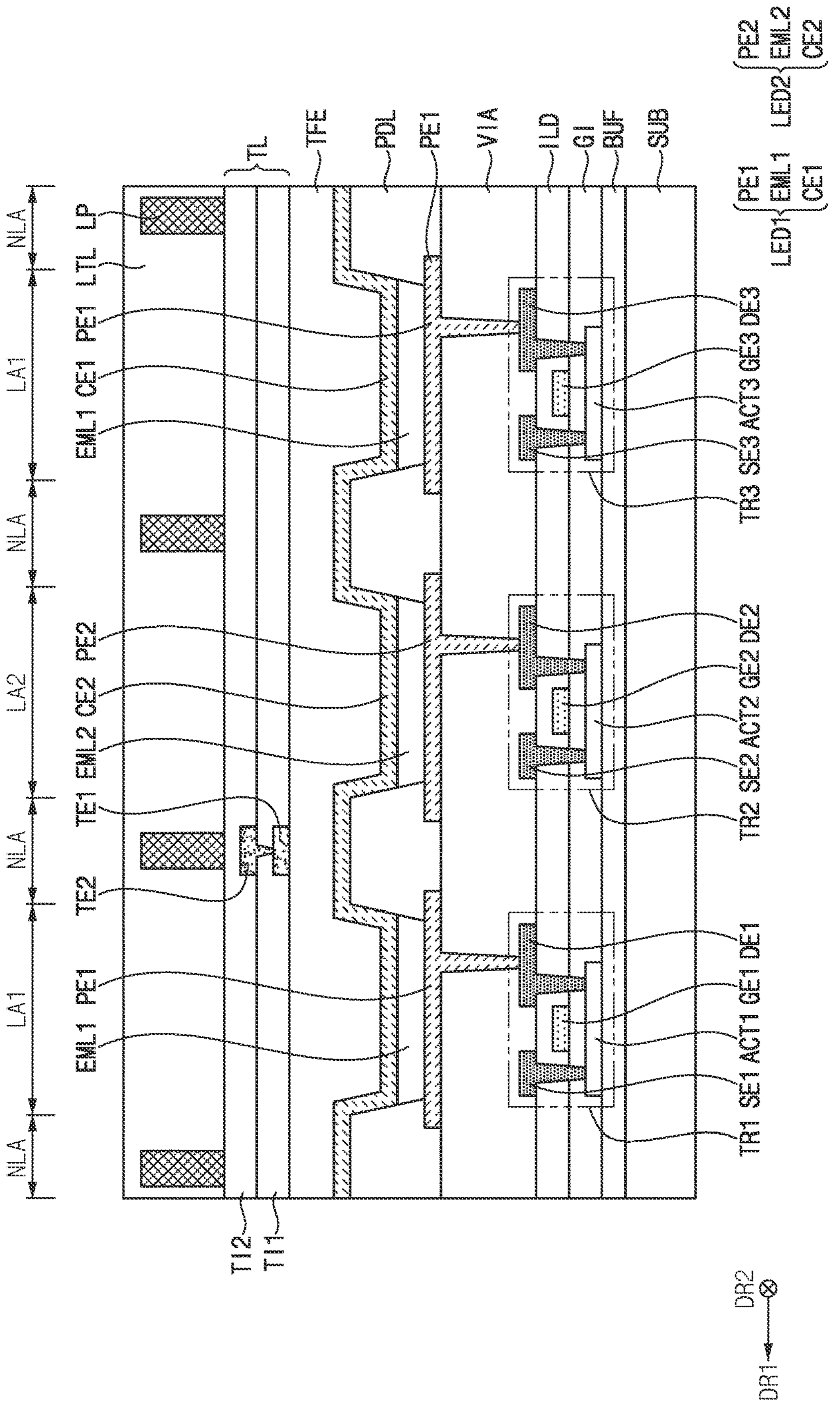
FIG. 16 is a cross-sectional view illustrating a display device according to another embodiment.

FIG. 16 is a cross-sectional view illustrating a display device according to another embodiment.

Referring to FIG. 16, the display device according to another embodiment may include the substrate SUB, the buffer layer BUF, the first, second, and third transistors TR1, TR2, and TR3, the gate insulating layer GI, the interlayer insulating layer ILD, the via insulating layer VIA, the pixel defining layer PDL, the first and second light emitting elements LED1 and LED2, the encapsulation layer TFE, a touch sensing layer TL, the plurality of light blocking patterns LP, and the light transmitting layer LTL. However, the display device described with reference to FIG. 16 may be substantially the same as or similar to the display device DD described with reference to FIG. 3 except for further including the touch sensing layer TL. In the following, redundant descriptions will be omitted or simplified.

The touch sensing layer TL may be disposed on the encapsulation layer TFE. The touch sensing layer TL may include a first touch electrode TE1, a first touch insulating layer TI1 disposed on the first touch electrode TE1, a second touch electrode TE2 disposed on the first touch insulating layer TI1, and a second touch insulating layer TI2 disposed on the second touch electrode TE2. The second touch insulating layer TI1 may have a substantially flat upper surface. The second touch electrode TE2 may be connected to the first touch electrode TE1 through a contact hole penetrating the first touch insulating layer TI1. The touch sensing layer TL may function as an input means of the display device.

Figure 17:
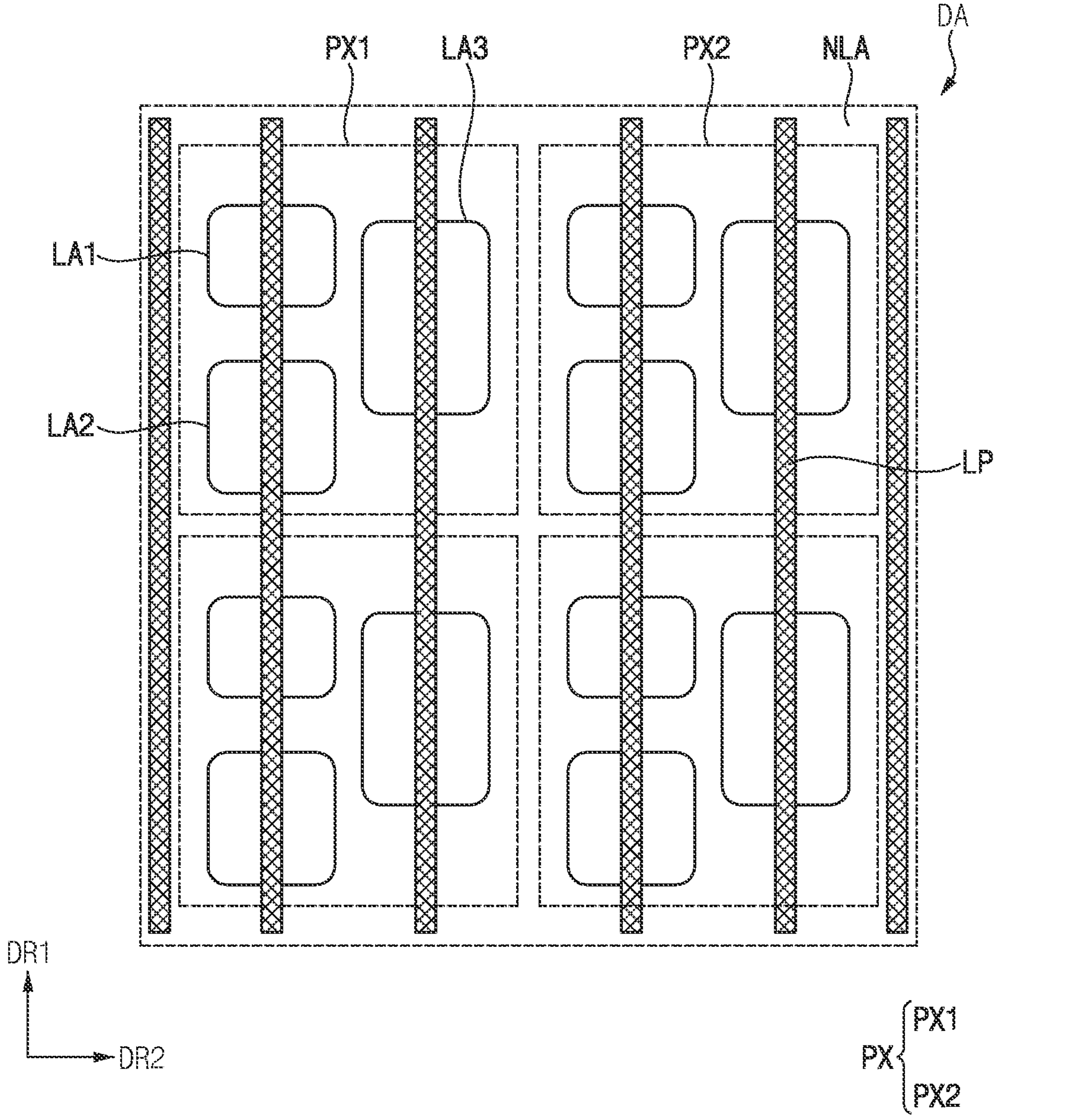
FIG. 17 is an enlarged plan view of a portion of a display area of a display device according to another embodiment.

FIG. 17 is an enlarged plan view of a portion of a display area of a display device according to another embodiment.

Referring to FIG. 17, the display device according to another embodiment may include the plurality of light blocking patterns LP. Hereinafter, descriptions overlapping those of the display device DD described with reference to FIG. 2 will be omitted or simplified.

The plurality of light blocking patterns LP may be arranged side by side with each other in a plan view. Each of the plurality of light blocking patterns LP may extend in the first direction DR1. The plurality of light blocking patterns LP may be spaced apart from each other in a second direction DR2 crossing the first direction DR1. The plurality of light blocking patterns LP may be parallel to each other. In addition, a portion of the plurality of light blocking patterns LP may overlap the first, second, and third light emitting regions LA1, LA2, and LA3, and another portion of the plurality of light blocking patterns LP may overlap the non-light emitting area NLA in a plan view.

Figure 18:
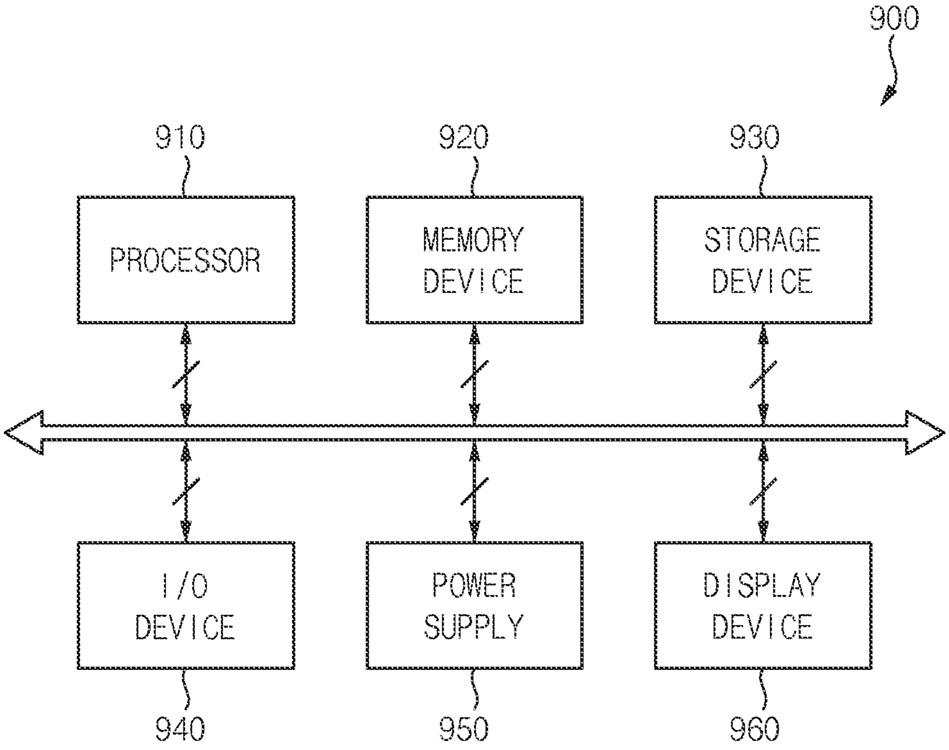
FIG. 18 is a block diagram illustrating an electronic device including the display device of FIG. 1.
Figure 19:
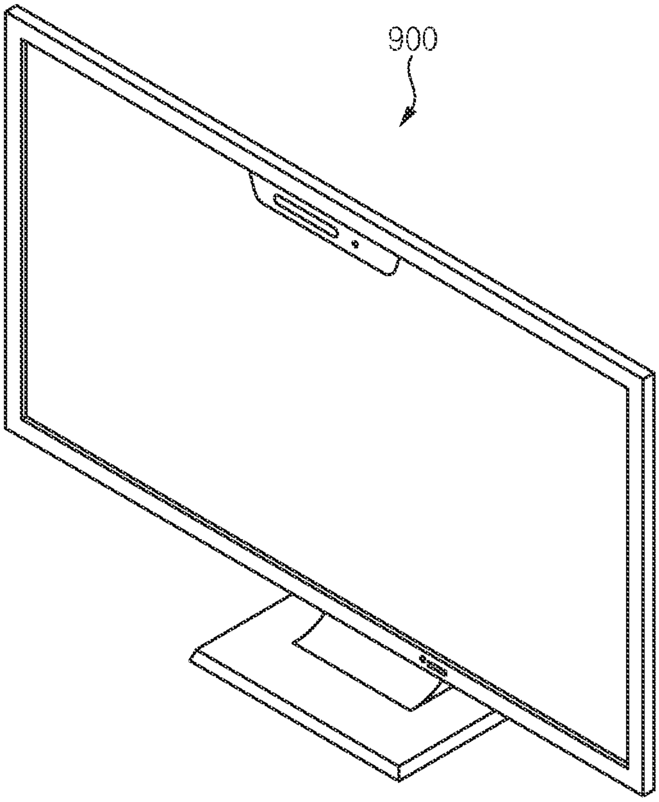
FIG. 19 is a view illustrating an example in which the electronic device of FIG. 18 is implemented as a television.
Figure 20:
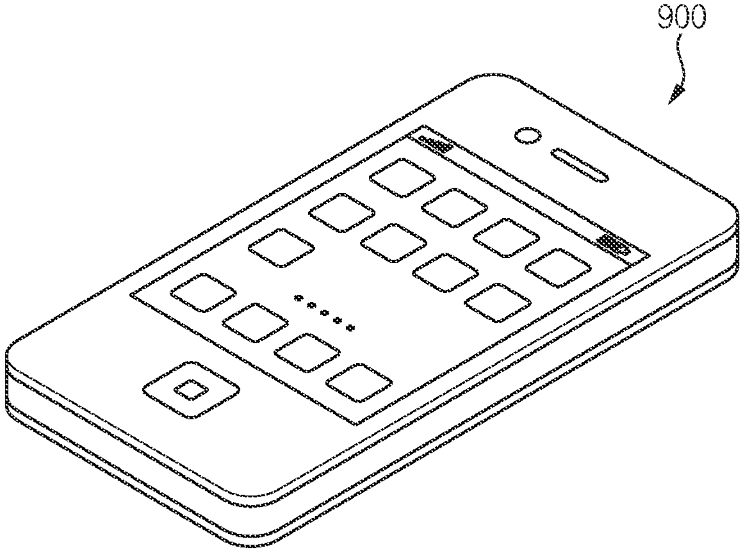
FIG. 20 is a view illustrating an example in which the electronic device of FIG. 18 is implemented as a smart phone.

FIG. 18 is a block diagram illustrating an electronic device including the display device of FIG. 1. FIG. 19 is a view illustrating an example in which the electronic device of FIG. 18 is implemented as a television. FIG. 20 is a view illustrating an example in which the electronic device of FIG. 18 is implemented as a smart phone.

Referring to FIGS. 18, 19 and 20, in an embodiment, the electronic device 900 may include a processor 910, a memory device 920, a storage device 930, an input/output ("I/O") device 940, a power supply 950 and a display device 960. In this case, the display device 960 may correspond to the display device DD described with reference to FIGS. 1, 2, 3, 4, 5, 16, and 17. The electronic device 900 may further include various ports capable of communicating with a video card, a sound card, a memory card, a USB device, and the like.

In an embodiment, as illustrated in FIG. 19, the electronic device 900 may be implemented as a television. In another embodiment, as illustrated in FIG. 20, the electronic device 900 may be implemented as a smart phone. However, embodiments are not limited thereto, in another embodiment, the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. The processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

The storage device 930 may include a solid state drive ("SSD") device, a hard disk drive ("HDD") device, a CD-ROM device, or the like.

The I/O device 940 may include an input device such as a keyboard, a keypad, a mouse device, a touchpad, a touch-screen, or the like, and an output device such as a printer, a speaker, or the like.

The power supply 950 may provide power for operations of the electronic device 900. The display device 960 may be coupled to other components via the buses or other communication links. In an embodiment, the display device 960 may be included in the I/O device 940.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
- a substrate including a light emitting area and a non-light emitting area adjacent to the light emitting area;
- a light emitting element including a light emitting layer disposed in the light emitting area on the substrate;
- an encapsulation layer disposed on the light emitting layer and including at least one inorganic layer and at least one organic layer; and
- a plurality of light blocking patterns disposed on the encapsulation layer,
- wherein each of the plurality of light blocking patterns has an asymmetric shape with respect to a virtual center line thereof and a value obtained by dividing a height of the each of the plurality of light blocking patterns by a distance between the plurality of light blocking patterns is equal to or greater than about 2.83, and a value obtained by dividing an average width of the each of the plurality of light blocking patterns by the distance between the plurality of light blocking patterns is about 0.25 or less.

2. The display device of claim 1, wherein each of the plurality of light blocking patterns includes:

a first side surface that is flat; and a second side surface facing the first side surface, wherein the second side surface is bent.

3. The display device of claim 1, wherein an angle formed between each of the plurality of light blocking patterns and an upper surface of the encapsulation layer is an acute angle or a right angle.

4. The display device of claim 1, wherein each of the plurality of light blocking patterns includes molybdenum-tantalum oxide (MTO) or an organic material including a black pigment.

5. The display device of claim 1, wherein each of the plurality of light blocking patterns overlaps the non-light emitting area and does not overlap the light emitting area in a plan view.

6. The display device of claim 1, wherein a portion of the plurality of light blocking patterns overlaps the light emitting area and another portion of the plurality of light blocking patterns overlaps the non-light emitting area in a plan view.

7. The display device of claim 1, further comprising:

a light transmitting layer disposed on the encapsulation layer, covering the plurality of light blocking patterns, and including a transparent organic material.

8. The display device of claim 1, further comprising:

a touch sensing layer disposed between the encapsulation layer and the plurality of light blocking patterns, and including a first touch electrode and a second touch electrode, wherein the second touch electrode is disposed on the first touch electrode and connected to the first touch electrode.

9. The display device of claim 6, wherein each of the plurality of light blocking patterns extends along a first direction and the plurality of light blocking patterns are spaced apart from each other along a second direction crossing the first direction.

10. An electronic device comprises:

a display device;

a processor; and a power supply which provides power for operations of the display device, wherein the display device includes:

a substrate including a light emitting area and a non-light emitting area adjacent to the light emitting area;

a light emitting element including a light emitting layer disposed in the light emitting area on the substrate;

an encapsulation layer disposed on the light emitting layer and including at least one inorganic layer and at least one organic layer; and a plurality of light blocking patterns disposed on the encapsulation layer, wherein each of the plurality of light blocking patterns has an asymmetric shape with respect to a virtual center line thereof and a value obtained by dividing a height of the each of the plurality of light blocking patterns by a distance between the plurality of light blocking patterns is equal to or greater than about 2.83, and a value obtained by dividing an average width of the each of the plurality of light blocking patterns by the distance between the plurality of light blocking patterns is about 0.25 or less.

* * * * *